Nov. 16, 1965 D. K. DAS 3,217,405

PLATING PROCESS

Filed June 27, 1962

*INVENTOR.*
DILIP K. DAS

United States Patent Office 3,217,405
Patented Nov. 16, 1965

3,217,405
PLATING PROCESS

Dilip K. Das, Bedford, Mass., assignor, by mesne assignments, to National Research Corporation, a corporation of Massachusetts Filed June 27, 1962, Ser. No. 205,638
3 Claims. (Cl. 29—528)

The present invention relates to superconducting materials and more particularly to the manufacture of members employing the superconducting compound, $Nb_3Sn$. This compound offers the best possibilities of withstanding high magnetic fields and carrying high current densities known to the art. However, it is very brittle. This limitation has limited its effective use. One approach to utilizing $Nb_3Sn$ is to form a thin layer of the compound on a ductile substrate of niobium, affording the ductility of the niobium base and the electrical properties of the $Nb_3Sn$ layer. This combination can be fabricated into superconducting members. Additionally, the electrical properties of this member will be superior to members using $Nb_3Sn$ in bulk form since thin films of $Nb_3Sn$, under certain conditions exhibit higher field tolerance than bulk $Nb_3Sn$.

Niobium is selected as the ductile substrate to expedite manufacture by providing a source of niobium in the article itself and the use of a controllable reaction to provide thin films of $Nb_3Sn$. Several of the processes for making the $Nb_3Sn$ layer, with this approach, entail the contacting of the niobium surface with tin and heating to produce a diffusion layer of $Nb_3Sn$. The contact can be achieved by depositing a tin layer on a niobium base without further treatment. However, this creates problems of obtaining uniform adherence of the tin to the niobium during subsequent heating to produce $Nb_3Sn$ (around 900° C.).

It is therefore an object of this invention to provide a method of plating niobium in a tin bath in a manner to obtain an adherent uniform coating of tin suitable for subsequent heat treatment to produce $Nb_3Sn$ at the niobium tin interfaces.

Another technique for precontacting the tin and niobium and expediting the niobium-tin-reaction is to cold work laminated elements of alternating niobium and tin to produce clean surface by longitudinal stretching. Again, it is desirable to have an adherent layer of tin on niobium in the first instance to prevent the stripping or squeezing out of tin during cold work. The method of the instant invention is suitable for use in combination with other techniques of bonding tin to niobium.

It is therefore a further object of this invention that the plating method will ensure a bond of tin to niobium that will withstand vigorous cold work as well as heating.

Other objects of the invention will in part be obvious and will in part appear hereinafter.

The invention accordingly comprises the process involving the several steps and the relation and order of one or more of such steps with respect to each other which are exemplified in the following detailed disclosure and the scope of the application of which will be indicated in the claims.

Figure 1:
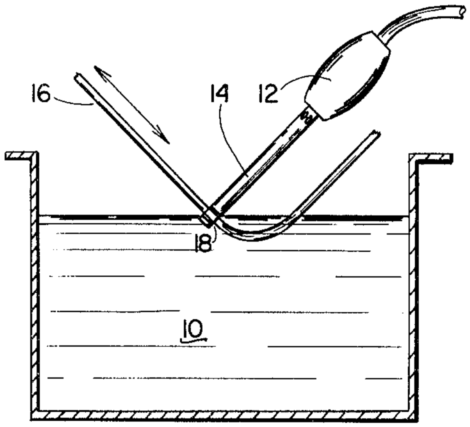
Figure 2:
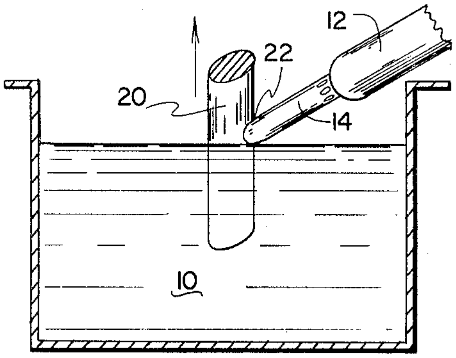

For a fuller understanding of the nature and objects of the invention, reference should be had to the following detailed description taken in connection with the accompanying drawings wherein:

FIG. 1 is a diagram of apparatus used in applying the process to plating niobium wire; and FIG. 2 is a diagram of apparatus used in applying the process to plating rods.

Referring now to FIG. 1 there is shown a molten tin bath 10. An ultrasonic soldering iron of conventional design, such as that shown in U.S. Patent 2,803,735, and known by the trademark Sonobond, is inserted into the bath. The iron 12 has a probe 14 with a .145 inch diameter hole 18 extending into the tin bath and delivers a power output of 12 watts. The use of this apparatus for plating niobium wire is illustrated by the following non-limiting example.

*Example*

A niobium wire 16, of smaller diameter than hole 18, was passed through hole 18 which was immersed as indicated in FIG. 1. The wire had been precleaned by abrasion. The tin bath was maintained at about 550° C. The iron 12 delivered an output of 60 kilocycles at 12 watts. The wire was rapidly drawn back and forth through the hole three times and formation of a smooth tin coating on the wire was observed.

The wire was then heat treated in an argon furnace at 800° C. for 100 minutes and then tested for critical current in a 13 kilogauss magnetic field at liquid helium temperatures. The wire had a critical current of 7.5 amperes.

It was noted that the net weight gain of the wire after plating and heating was 10 times that of equivalent wires which were electroplated at 100 milliamperes for 115 seconds and then heat treated, as above. The favorable results with respect to both critical current and weight gain indicate that the tin breaks through barrier layers to wet the niobium and form a bond which will hold long enough under the subsequent heat treatment to inhibit the tendency of the tin to ball up prior to the formation of a diffusion layer of $Nb_3Sn$ at the niobium tin interface. Once this compound forms, the vapor pressure of the tin trapped is suppressed. It is possible to vary the thickness of the diffusion layer by control of the time and temperature parameters during heating.

It is believed that the superior plating is obtained via cavitation established by the high frequency vibrations in the region of the niobium surface. The essence of the instant invention is in using this particular technique to prepare the niobium and tin for the subsequent heating to produce a uniformly thin layer of $Nb_3Sn$.

In a second preferred embodiment of the invention shown in FIG. 2, a rod 20 is plated by dipping in the molten tin bath 10 and drawing it out while painting on with the ultrasonic soldering iron. The probe 14 of the iron is modified by the provision of a curved tip 22 corresponding to the curvature of the rod 20. After plating, the rod may be heat treated to form the $Nb_3Sn$ diffusion layer at the niobium-tin interface or cold worked down to wire and then heat treated.

In both of the above embodiments, the plating was carried on above or near the surface of the tin bath to avoid damping of the vibrations. In industrial applications, the treated niobium should be submerged and higher power outputs should be used. The process of the instant invention may be applied to niobium sheet as well as wire and rods.

Since certain changes may be made in the above process without departing from the scope of the invention herein involved, it is intended that all matter contained in the above description, shall be interpreted as illustrative and not in a limiting sense.

What is claimed is:

1. A method of producing a wire having a uniform thin film of superconductive niobium stannide comprising the steps of maintaining a molten tin bath at about 550° C., leading a niobium wire through said molten tin bath to deposit tin on the wire and then through an orifice wall, vibrating the orifice wall at a frequency of 60,000 kilocycles to establish vibration at ultrasonic frequency in the wire, drawing the wire back and forth through said orifice, whereby a smooth tin coating is formed, removing the coated wire from said bath, then heating the tin-coated niobium wire at a temperature between 800° and 1100° C. to react the tin with the niobium to form a niobium stannide layer at the wire surface.

2. A method of producing a wire having a uniform thin film of superconductive niobium stannide comprising the steps of passing a niobium rod through a molten tin bath, contacting the rod with a vibrating member to establish ultrasonic vibrations in the rod while in the tin bath whereby a smooth coating of tin is formed on the rod, removing the coated rod from said bath, working the coated rod down to wire size, then heating the tin coated niobium wire at a temperature between 800° and 1100° C. to react the tin with the niobium to form a niobium stannide layer at the wire surface.

3. A method of producing an elongated niobium body having a uniform thin film of superconductive niobium stannide comprising the steps of passing said niobium body through a molten tin bath, contacting the body with a vibrating member to establish ultrasonic vibrations in the body while in the tin bath, whereby a smooth coating of tin is formed on the body, removing the coated body from said bath, working the coated member to elongate it, then heating it to react the tin coating in place with niobium to form a layer of niobium stannide.

References Cited by the Examiner

UNITED STATES PATENTS

| | | | |
|---|---|---|---|
| 2,432,657 | 12/1947 | Colbert et al. ----- | 117—107 X |
| 3,124,455 | 3/1964 | Buehler et al. ---- | 29—191.2 X |

FOREIGN PATENTS

| | | |
|---|---|---|
| 137,999 | 5/1948 | Australia. |

OTHER REFERENCES

Chemical & Engineering News, pp. 41 and 42, Feb. 20, 1961.

Chemical & Engineering News, pp. 34 and 35, Mar. 12, 1962.

WHITMORE A. WILTZ, *Primary Examiner.*